US008159251B2

(12) United States Patent
Sasaki et al.

(10) Patent No.: US 8,159,251 B2
(45) Date of Patent: *Apr. 17, 2012

(54) PROBE CARD FOR SEMICONDUCTOR WAFER

(75) Inventors: Shunsuke Sasaki, Tokyo (JP); Hiroshi Nakayama, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/801,790

(22) Filed: Jun. 25, 2010

(65) Prior Publication Data

US 2011/0050266 A1 Mar. 3, 2011

Related U.S. Application Data

(63) Continuation of application No. 11/991,296, filed as application No. PCT/JP2006/317126 on Aug. 30, 2006, now Pat. No. 7,772,858.

(30) Foreign Application Priority Data

Aug. 31, 2005 (JP) ................................. 2005-252804

(51) Int. Cl.
*G01R 31/00* (2006.01)
(52) U.S. Cl. ......... 324/756.03; 324/755.03; 324/754.07; 324/756.01; 324/756.05
(58) Field of Classification Search ............. 324/755.03, 324/756.01
See application file for complete search history.

(56) References Cited

U.S. PATENT DOCUMENTS

| | | | | |
|---|---|---|---|---|
| 6,005,401 | A * | 12/1999 | Nakata et al. | 324/756.03 |
| 6,350,957 | B1 * | 2/2002 | Shingai et al. | 174/254 |
| 6,623,563 | B2 * | 9/2003 | Hosokawa | 118/728 |
| 6,642,729 | B2 | 11/2003 | Kang et al. | |
| 6,831,455 | B2 * | 12/2004 | Yonezawa | 324/756.03 |
| 6,972,578 | B2 * | 12/2005 | Martens et al. | 324/754.07 |
| 7,285,968 | B2 | 10/2007 | Eldridge et al. | |
| 7,772,858 | B2 * | 8/2010 | Sasaki et al. | 324/756.03 |
| 7,898,272 | B2 * | 3/2011 | Sasaki et al. | 324/756.03 |
| 2003/0085723 | A1 | 5/2003 | Martens et al. | |
| 2004/0090223 | A1 | 5/2004 | Yonezawa | |
| 2005/0001637 | A1 | 1/2005 | Kazama | |
| 2005/0156613 | A1 * | 7/2005 | Hosaka | 324/754 |
| 2006/0061375 | A1 | 3/2006 | Mori | |
| 2010/0026331 | A1 | 2/2010 | Chong et al. | |

FOREIGN PATENT DOCUMENTS

JP 06-050990 2/1994

(Continued)

OTHER PUBLICATIONS

Taiwanese Office Action issued Jul. 18, 2008 in No. 095132134.

(Continued)

*Primary Examiner* — Richard Isla Rodas
(74) *Attorney, Agent, or Firm* — Edwards Wildman Palmer LLP

(57) ABSTRACT

A probe card includes a plurality of probes that contacts a plurality of electrodes provided in the semiconductor wafer and that inputs or outputs an electrical signal in or from the electrodes, a probe head that holds the probes, a substrate having a wiring which is provided near the surface of the substrate facing the probe head so as to be contactable with the probe head and is connected to the probes, a core layer formed of a material which is buried in the substrate and has a coefficient of thermal expansion lower than that of the substrate, and a connecting member that electrically connects at least some of the probes with an external device via the wiring.

7 Claims, 13 Drawing Sheets

FOREIGN PATENT DOCUMENTS

| | | |
|---|---|---|
| JP | 2000-208570 | 7/2000 |
| JP | 2002-313856 A | 10/2002 |
| JP | 2003-240801 | 8/2003 |
| JP | 2004-205487 | 7/2004 |
| WO | WO-03-003027 | 1/2003 |

OTHER PUBLICATIONS

Notice of Rejection mailed May 31, 2011, issued for the corresponding Japanese patent application No. 2005-252804.

* cited by examiner

PROBE CARD FOR SEMICONDUCTOR WAFER

CROSS-REFERENCE TO RELATED APPLICATIONS

This application is a Continuation of U.S. application Ser. No. 11/991,296, filed Apr. 10, 2009 now U.S. Pat. No. 7,772,858 which is a U.S. National Stage Application of PCT/JP2006/317126, filed Aug. 30, 2006, which claims priority to JP-2005-252804, filed Aug. 31, 2005, the entire contents of which are hereby incorporated by reference.

TECHNICAL FIELD

The present invention relates to a probe card that inputs or outputs an electrical signal to or from a plurality of areas of a semiconductor wafer which is a test object.

BACKGROUND ART

In the process of testing a semiconductor, electrical continuity of the semiconductor in a state of a semiconductor wafer before being diced is tested by contacting a conductive probe with the semiconductor wafer and a defective piece is sometimes detected (WLT: Wafer Level Test). When conducting the WLT, a probe card that contains many probes is used to deliver test signals from test equipment (tester) to the semiconductor wafer. Generally, in the WLT, each probe is made to contact each die when scanning the die on the semiconductor wafer with the probe card. However, because hundreds to tens of thousands of dies are present on one semiconductor wafer, it takes considerably long time for testing one semiconductor wafer, and an increase in the number of dies causes an increase in cost.

To take care of this issue, recently, a method called FWLT (Full Wafer Level Test) is used. In the FWLT, the probes are collectively contacted with all the dies on the semiconductor wafer or at least about ¼ to ½ of dies on the semiconductor wafer (for example, see Patent document 1). In the FWLT, the tip of each probe must contact with a fine electrode pad of the semiconductor wafer, and this requires a technology for increasing accuracy of positioning the tips of the probes and for aligning the probe card with the semiconductor wafer.

FIG. 13 is a schematic diagram of one example of structure of a probe card used in the FWLT. A probe card 51 as shown in the figure includes a plurality of probes 52 provided corresponding to a layout pattern of electrode pads on the semiconductor wafer, a probe head 53 that holds the probes 52, a space transformer 54 that transforms a fine wiring pattern in the probe head 53 into a wiring pattern in a wider space, an interposer 55 that relays a wiring extended from the space transformer 54, and a substrate 57 that further increases the space of the wiring 56 relayed by the interposer 55 and connects the wiring 56 to a terminal of the test equipment.

In the probe card 51 structured as explained above, the space transformer 54 serves also as a function of reducing a difference between the coefficient of thermal expansion of the semiconductor wafer and the coefficient of thermal expansion of the substrate 57, and occurrence of displacement is thereby prevented upon testing in a high temperature environment.

Patent document 1: Japanese Patent Application Laid-Open No. 2003-240801

DISCLOSURE OF INVENTION

Problem to be Solved by the Invention

However, when the probe card is formed by using the space transformer, electrical loss easily occurs due to connection between the space transformer and the substrate, and a problem may arise with regard to transmission characteristics of an electrical signal having particularly high frequency. Moreover, provision of the space transformer and the interposer causes the number of components to increase, which results in an increase in the number of assembly steps, and thus it is difficult to reduce cost.

The present invention has been achieved to solve the conventional problems, and it is an object of the present invention is to provide an economical low-cost probe card excellent in transmission characteristics of high-frequency electrical signals.

Means for Solving Problem

To solve the above problems and to achieve the above objects, a probe card according to the invention disclosed in claim 1 inputs or outputs an electrical signal in or from a plurality of areas on a semiconductor wafer which is a test object and includes a plurality of probes that contacts a plurality of electrodes provided in the semiconductor wafer and that inputs or outputs an electrical signal in or from the electrodes; a probe head that holds the probes; a substrate having a wiring which is provided near the surface of the substrate facing the probe head so as to be contactable with the probe head and is connected to the probes; a core layer formed of a material which is buried in the substrate and has a coefficient of thermal expansion lower than that of the substrate; and a connecting member that electrically connects at least some of the probes with an external device via the wiring.

In the invention in claim 2, in addition to the invention in claim 1, the connecting member includes a through hole formed in a wall-thickness direction of the substrate by being penetrated in a wall-thickness direction of an area where the core layer is not buried.

In the invention in claim 3, in addition to the invention in claim 1, the connecting member includes either one of a zero insertion force type of male connector and that of female connector which form a pair and are to be mutually connected to each other.

In the invention in claim 4, in addition to the invention in claim 3, the substrate includes a cutout portion in which either one of the male connector and the female connector is fitted.

In the invention in claim 5, in addition to the invention in claim 3, the substrate includes an opening in which either one of the male connector and the female connector is fitted.

In the invention in claim 6, in addition to the invention in claim 5, either one of the male connector and the female connector includes a first connector connectable with a connector as a counterpart thereof; and a second connector that is fitted in the opening, is electrically connected to the wiring, and is connected to the first connector.

The invention in claim 7, in addition to the invention in any one of claims 1 to 6, further includes a reinforcing element attached to an outer periphery of the substrate.

Effect of the Invention

According to the present invention, it is possible to provide an economical low-cost probe card excellent in transmission characteristics of high-frequency electrical signals by providing a plurality of probes that contact a plurality of electrodes formed on a semiconductor wafer which is a test object to input or output electrical signals to or from the electrodes, a probe head that holds the probes, a substrate having a wiring which is provided near the surface of the substrate facing the probe head so as to be contactable with the probe head and is connected to the probes, a core layer formed of a material which is buried in the substrate and has a coefficient of thermal expansion lower than that of the substrate, and a connecting member that electrically connects at least some of the probes with an external device via the wiring.

Figure 1:
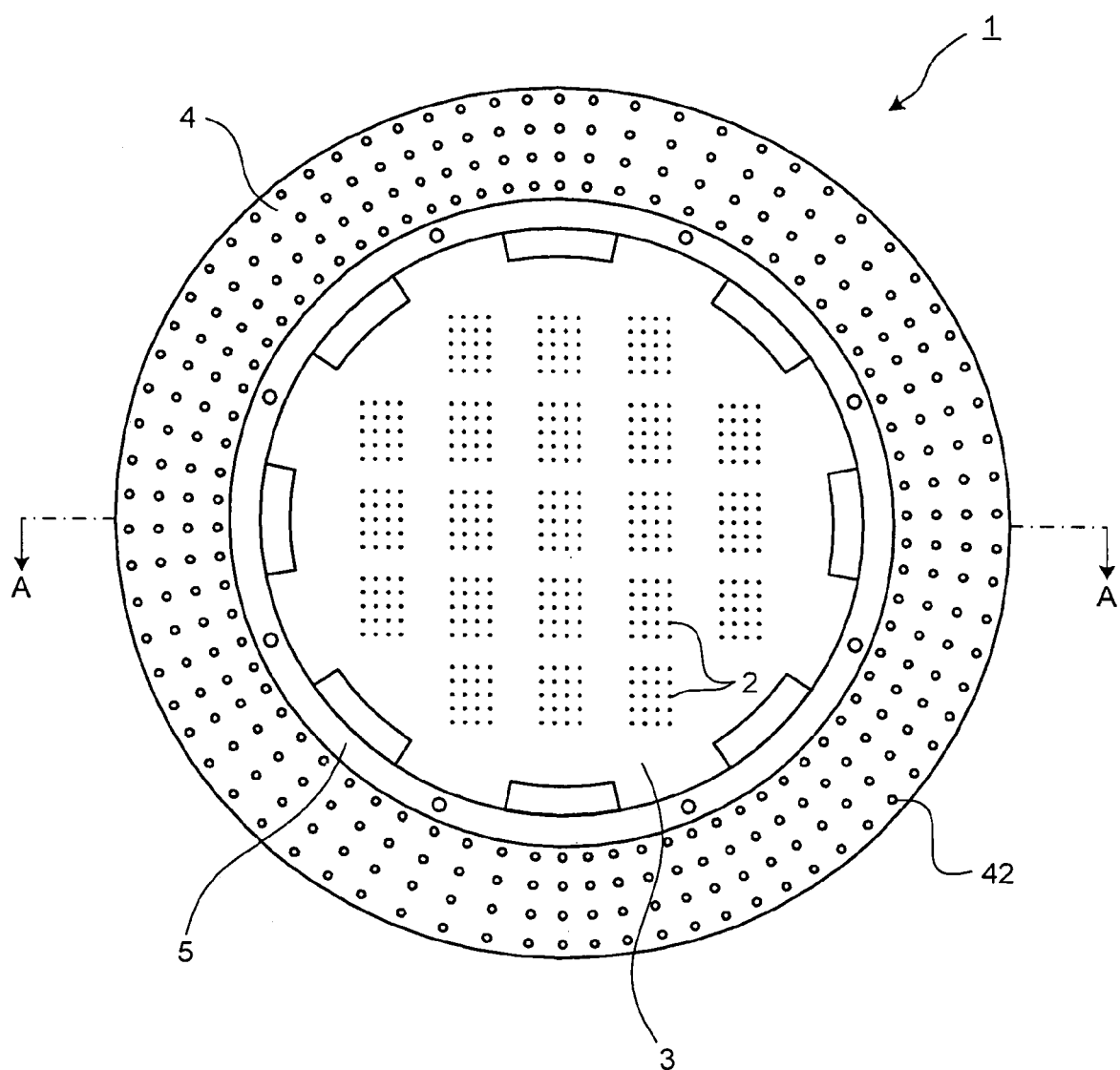
FIG. 1 is a plan view of a structure of a probe card according to a first embodiment of the present invention.

EXPLANATIONS OF LETTERS OR NUMERALS 1, 11, 12, 17, 51 Probe card
2, 52 Probe
3, 53 Probe head
4, 4-2, 13, 18, 57 Substrate
5 Holding element
6, 14, 20 Core layer
7 Semiconductor wafer
8 Terminal
9 Reinforcing element
15, 19 Male connector
15a Connecting portion
15b First flange portion
15c Trunk portion
15d Second flange portion
16 Female connector
21 Spring element
21a Coarsely wound portion
21b Densely wound portion
22, 23 Needle-like body
22b, 23c Boss portion
22c Shaft portion
22a, 23a Needle-like portion
23b Flange portion
31, 122, 152, 153, 172, 195, 196 Hole
31a Small-diameter hole
31b Large-diameter hole
41, 56, 131, 181 Wiring
42 Through hole
43, 132, 182 Electrode
54 Space transformer
55 Interposer
61, 81 Screw
71 Electrode pad
91 Outer peripheral portion
92 Spoke
93 Central portion
101 Wafer chuck
121 Cutout portion
151, 161, 193, 194 Lead
171 Opening
191 First connector
191a First connecting portion
191b Third flange portion
191c Second connecting portion
192 Second connector
192a Fourth flange portion
192b Fitting portion
201 Terminal seat
301 Connector seat

BEST MODE(S) FOR CARRYING OUT THE INVENTION

Exemplary embodiments (hereinafter, "embodiments") for implementing the present invention are explained below with reference to the accompanying drawings. It should be noted that the drawings are schematically drawn and thus a relationship between a thickness and a width of each portion and a ratio between thicknesses in respective portions may be different from actual ones. Moreover, it is obvious that between the drawings, there may be some different portion in terms of a relationship of mutual dimensions and of a ratio thereof.

First Embodiment

Figure 2:
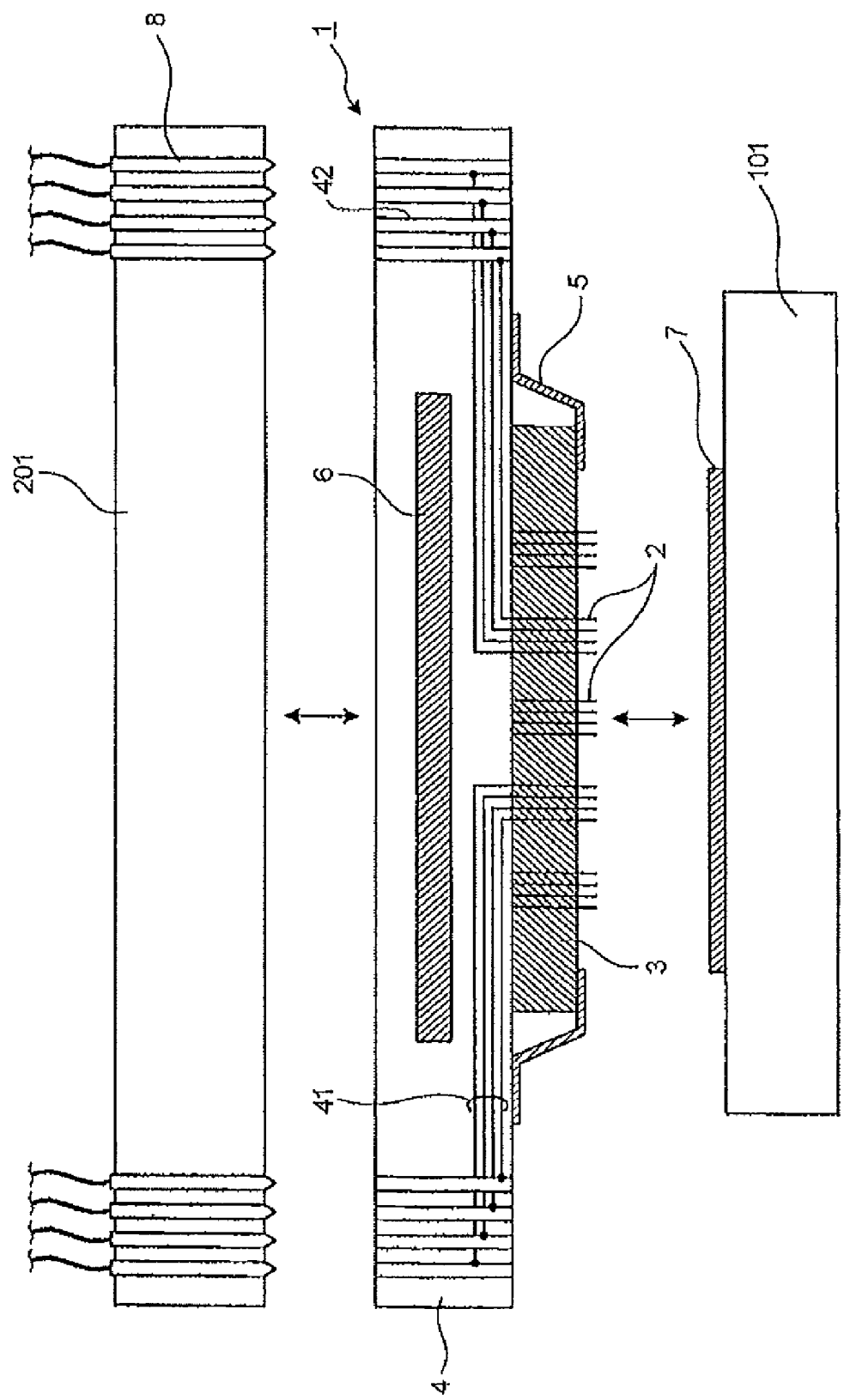
FIG. 2 is a cross section of part of a cross-sectional structure taken along the line A-A of FIG. 1.

FIG. 1 is a plan view of a structure of a probe card according to a first embodiment of the present invention. FIG. 2 is a cross section of part of a cross-sectional structure taken along the line A-A of FIG. 1. A probe card 1 shown in these figures includes a plurality of probes 2 (conductive contacts) arranged corresponding to a test object, a disc-like probe head 3 that holds the probes 2, a disc-like substrate 4 having a wiring pattern for electrically connecting the probes 2 held in the probe head 3 with test equipment and having its diameter larger than that of the probe head 3, a holding element 5 fixed to the substrate 4 and formed of a disc spring or a plate spring or the like so as to hold the probe head 3, and a core layer 6 formed of a material which is buried in the substrate 4 and has a coefficient of thermal expansion (CTE) lower than that of the substrate.

As shown in FIG. 2, the probe card 1 is electrically connected to the main body of the test equipment (not shown) which is an external device via terminals 8 held in a terminal seat 201 of the test equipment. A pogo pin or the like that functions as a spring is used for the terminal 8, and by transmitting/receiving a predetermined electrical signal via the terminal 8, electrical characteristics of a semiconductor wafer 7 is measured. It is noted that FIG. 2 represents how the semiconductor wafer 7 being a contact object for the probes 2 is placed on a wafer chuck 101 of the test equipment.

The probes 2 are arranged so that one ends thereof protrude corresponding to the layout pattern of the electrode pads on the semiconductor wafer 7 generally formed in a disc shape, and the ends of the probes 2 come in contact with the surfaces of the electrode pads on the semiconductor wafer 7 from the vertical direction thereof.

The number of probes 2 held in the probe head 3 and the layout pattern are determined according to the number of semiconductor chips and the layout pattern of the electrode pads formed on the semiconductor wafer 7. For example, if a semiconductor wafer 7 with a diameter of 8 inches (about 200 millimeters) is to be tested, hundreds to thousands of probes 2 are needed. And if a semiconductor wafer 7 with a diameter of 12 inches (about 300 millimeters) is to be tested, thousands to tens of thousands of probes 2 are needed.

Figure 3:
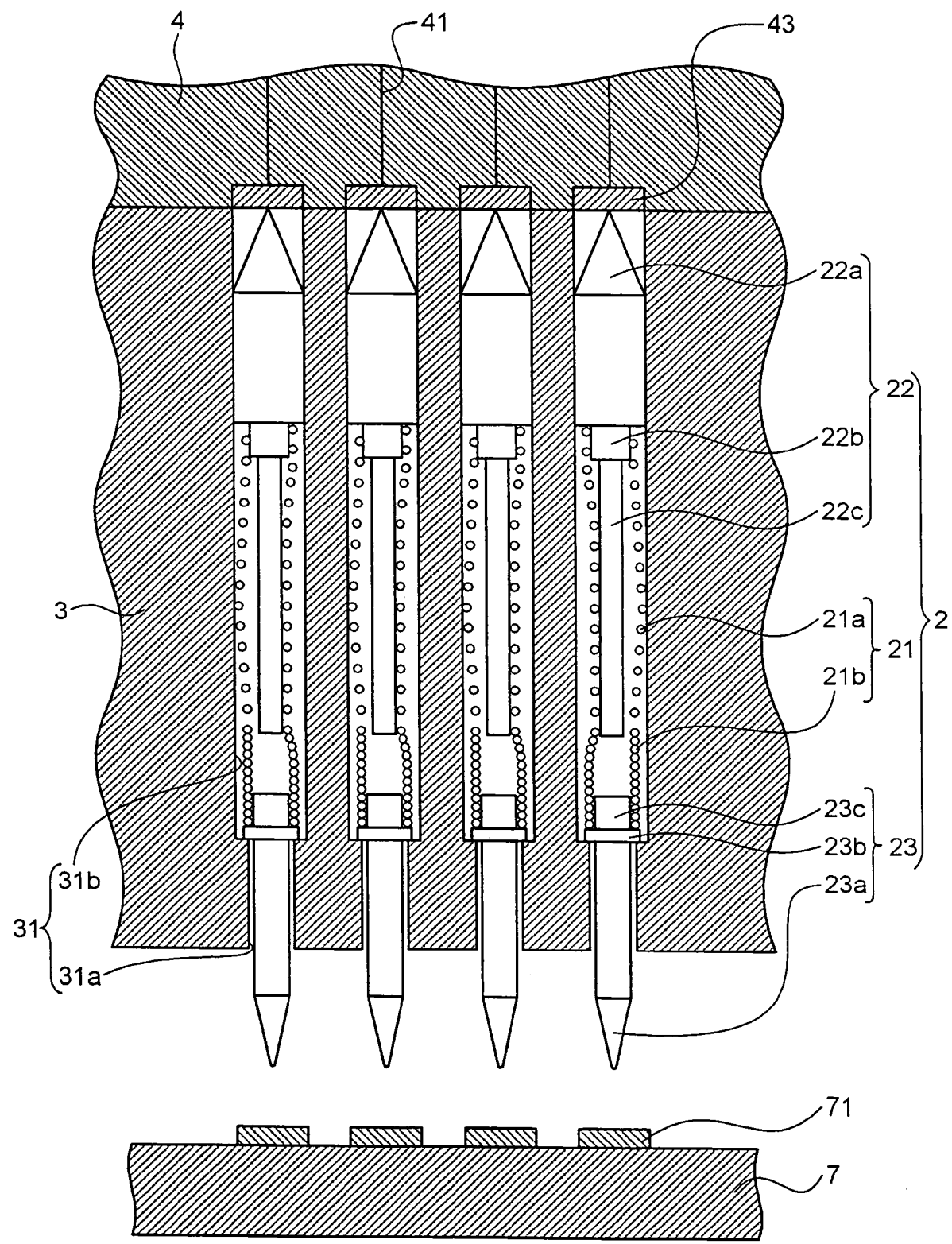
FIG. 3 is an enlarged partial cross section of a structure of a main portion of a probe and a probe head provided in the probe card according to the first embodiment.

FIG. 3 is an enlarged partial cross section of a structure of a main portion of the probe 2 and the probe head 3. The probe 2 includes a spring element 21 formed of a conductive coil spring, and a pair of needle-like bodies 22 and 23 formed of a conductive material and disposed in both ends of the spring element 21 in such a manner that respective pointed ends of the needle-like body are directed in mutually opposite directions. When the probes 2 are held in the probe head 3, the needle-like body 22 is located at a position closer to the side of the substrate 4 than the spring element 21 (vertically upper side in FIG. 3), while the needle-like body 23 is located at a position closer to the side of the semiconductor wafer 7 than the spring element 21 (vertically lower side in FIG. 3).

The needle-like body 22 includes a needle-like portion 22a including the pointed end which contacts an electrode 43 formed on the substrate 4, a boss portion 22b which protrudes from a base end on the opposite side to the pointed end of the needle-like portion 22a and which has a diameter smaller than that of the needle-like portion 22a, and a shaft portion 22c which extends from the surface on the opposite side of the side where the boss portion 22b contacts the needle-like portion 22a. And the needle-like body 22 is symmetric with respect to its longitudinal axis. On the other hand, the needle-like body 23 includes a needle-like portion 23a including the pointed end which contacts an electrode pad 71 formed on the semiconductor wafer 7, a flange portion 23b which is provided on a base end on the opposite side to the pointed end of the needle-like portion 23a and which has a diameter larger than that of the needle-like portion 23a, and a boss portion 23c which protrudes from the surface on the opposite side of the side where the flange portion 23b contacts the needle-like portion 23a and which has a diameter smaller than that of the flange portion 23b. And the needle-like body 23 is symmetric with respect to its longitudinal axis.

The spring element 21 has a coarsely wound portion 21a provided in the side of the needle-like body 22 and has a densely wound portion 21b provided in the side of the needle-like body 23. The end of the coarsely wound portion 21a is wound around the boss portion 22b of the needle-like body 22, while the end of the densely wound portion 21b is wound around the boss portion 23c of the needle-like body 23. The densely wound portion 21b and the boss portion 23c are joined to each other by a winding force of the spring and/or by soldering, and the coarsely wound portion 21a and the boss portion 22b are joined to each other in the same manner as above. By providing the spring element 21 in the probe 2, the needle-like bodies 22 and 23 can elastically move in the vertical direction in FIG. 3. The pointed end of the needle-like portion 23a of the needle-like body 23, of the both pointed ends, is made to contact the electrode pad 71 by moving up the semiconductor wafer 7.

The probe head 3 is formed by using, for example, a ceramic material, and includes holes 31 that penetrate in the wall thickness direction (vertical direction in FIG. 3) according to the layout on the semiconductor wafer 7 so that the probes 2 are held in the holes 31 respectively. The hole 31 has a small-diameter hole 31a formed from the lower side of the hole 31 in FIG. 3 or from the edge of the hole 31 on the side of the semiconductor wafer 7 over a predetermined length which is shorter than the length of at least the needle-like portion 23a in the longitudinal direction. As a rest portion of the hole 31, a large-diameter hole 31b of which diameter is larger than the small-diameter hole 31a is formed coaxially with the small-diameter hole 31a. As is clear from FIG. 3, the inner diameter of the small-diameter hole 31a is larger than the outer diameter of the needle-like portion 23a of the needle-like body 23 and is smaller than the outer diameter of the flange portion 23b. The hole 31 is formed in a stepped hole in the above manner, which prevents the needle-like body 23 forming the probe 2 from dropping downwardly out of the hole 31.

It is noted that the probe head 3 may be structured by being vertically divided into two parts along the vertical direction of FIG. 3. In this case, the two parts are engaged with screws and locating pins, however, to prevent a lower-side plate from its expansion due to initial load of the probe 2, it is set so that the thickness of the part of the lower side is thicker than that of the part of the upper side. The division of the probe head 3 in the above manner allows easy replacement of the probe 2, or the like.

The substrate 4 is formed of an insulating material such as bakelite and epoxy resin used for an ordinary PCB (Printed Circuit Board). Buried in the substrate 4 is the core layer 6 formed in a disc shape whose diameter is slightly larger than that of the probe head 3. The core layer 6 is formed of a material having a coefficient of thermal expansion lower than that of the insulating material forming the substrate 4. More specifically, the core layer 6 is formed of an invar material, a cobal material (TM), or the like. Moreover, any material having a negative coefficient of thermal expansion so as to shrink as temperature rises may also be used as the core layer 6.

In an area of the substrate 4 on the side nearer to the probe head 3 than the core layer 6 or in an area near the surface of the substrate 4 facing the probe head 3, a wiring 41 to electrically connect the probe 2 with the test equipment is three-dimensionally formed by a via hole or the like. On the other hand, the wiring is not provided on the side more distant from the probe head 3 than the core layer 6 or on the side of the test equipment. In this sense, a wiring layer (wiring pattern) including a plurality lines of wiring 41 is formed only on the one side of the substrate 4 near the probe head 3.

One end of the wiring 41 is connected to the needle-like body 22 of the probe 2 in the probe head 3 via the electrode 43 formed in the lower end portion of the substrate 4. The other end of the wiring 41 is connected to any one of a plurality of through holes 42 which penetrates the substrate 4 in the thickness direction of the substrate 4 near the outer edge of the substrate 4 or in the parallel direction to the vertical direction in FIG. 2. It is noted that FIG. 2 represents only part of the lines of the wiring 41 to simplify the description.

Generally, when the test is conducted by using the probe card 1, the semiconductor wafer 7 is often tested in an environment at higher temperature than normal temperature, such as a burn-in test. Therefore, the coefficient of thermal expansion of the semiconductor wafer 7 and the coefficient of thermal expansion of the probe head 3 and of the substrate 4 are preferably as close as possible to each other. For example, the coefficient of thermal expansion of the semiconductor wafer 7 (silicon wafer) containing silicon as a main component is about 3.4 (ppm/° C.) while the coefficient of thermal expansion of the substrate 4 is about 12 to 15 (ppm/° C.).

Therefore, to accurately conduct the test, the difference needs to be reduced. In the first embodiment, a material (containing a material having a negative coefficient of thermal expansion) of which coefficient of thermal expansion is significantly lower than that of the substrate 4 is buried in the substrate 4 and layered, as the core layer 6, to reduce the difference between the coefficients of the thermal expansion. A relationship in thickness between the substrate 4 and the core layer 6 and a specific material only have to be optimized according to a relationship between the coefficient of thermal expansion of the semiconductor wafer 7 and the coefficient of thermal expansion of the overall probe card 1 or according to conditions such as an environment in which the test is conducted.

However, the coefficient of thermal expansion of the semiconductor wafer 7 and the coefficient of thermal expansion of the overall probe card 1 may not be perfectly coincident with each other, and thus the difference therebetween has only to be reduced to such an extent that no failure may occur in electrical connection between the electrode pad 71 of the semiconductor wafer 7 and the probe 2. Furthermore, the coefficients of thermal expansion are not made to match each other in all the temperature conditions, and thus the level of the thermal expansion of the probe card 1 and that of the semiconductor wafer 7 have only to match each other in the temperature conditions upon testing in such a manner that the levels will not affect the accuracy of the test.

Figure 13:
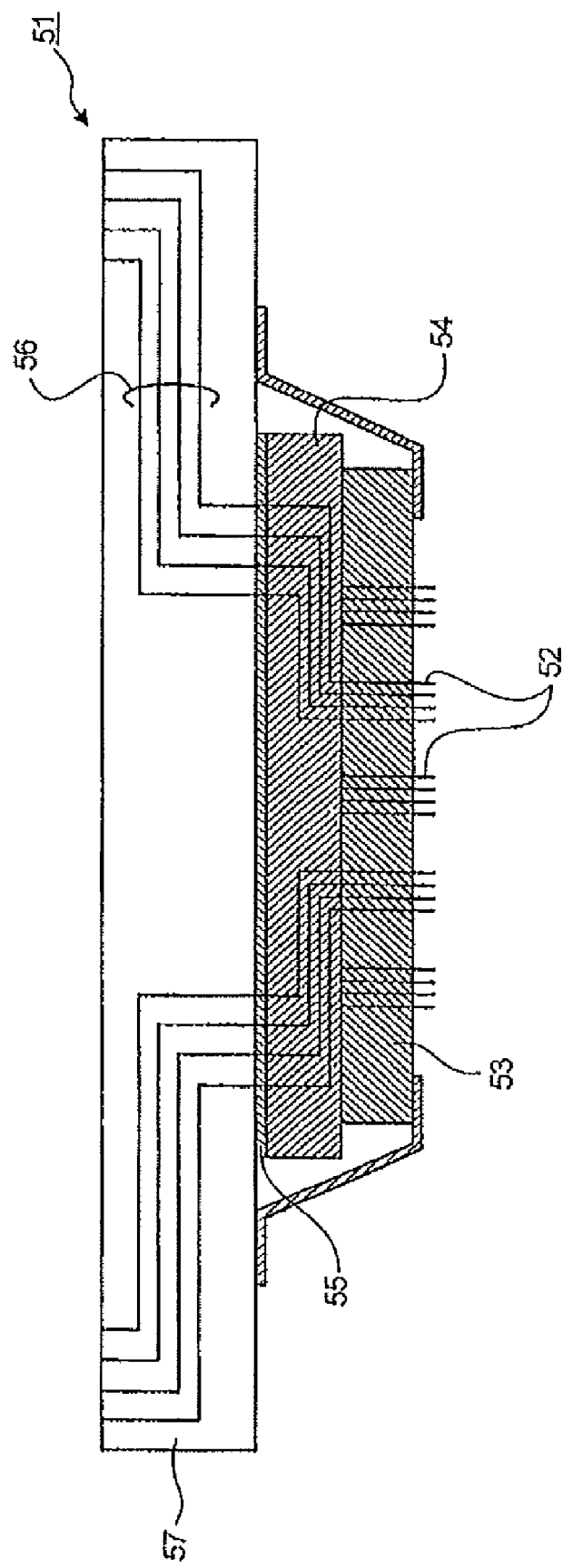
FIG. 13 is a schematic diagram of a structure of a conventional probe card.

In the probe card 1 structured in the above manner, the core layer 6 is formed only in an area near the central portion of the disc where the probe head 3 is fixed, and the core layer 6 is not formed along outer periphery of the substrate 4 with which the terminals 8 of the test equipment are contacted. Therefore, the through holes 42 that penetrate the substrate 4 in the thickness direction (vertical direction of FIG. 2) can easily be formed along the outer periphery of the substrate 4, and thus, there is no need to establish a connection with the test equipment by extending the wiring 41 up to the side of the terminal 8, unlike the conventional probe card 51 as shown in FIG. 13. Consequently, only a smaller number of steps of forming the substrate 4 are needed. Therefore, it is possible to resolve the difference in the coefficient of thermal expansion of the probe card from that of the semiconductor wafer 7, prevent displacement that may possibly occur in the temperature environment upon testing, and implement more accurate testing.

The following processes can be used to form the through holes 42, such as punching process, laser machining, electron beam machining, ion beam machining, wire electric discharge machining, press machining, wire cutting machining, or etching process. The layout pattern of the through holes 42 is not limited by the case shown in FIG. 1.

To provide the wiring layer on the one side of the substrate 4, it is also considered that the surface area of the core layer 6 and the surface area of layers forming the substrate 4 are made the same size as each other so that the core layer 6 is completely sandwiched between the layers, however, this case includes the following problems:

(1) It is technically difficult to form through holes passing through the core layer 6 that has the above-mentioned characteristics.

(2) Because the electrodes for wiring to the test equipment are formed on the side of the surface that contacts the probe head 3, it is not realistic that the wiring is provided to the surface on the opposite side of the side or provided to the surface on the side of the test equipment, because the number of terminals is in a range of hundreds to tens of thousands.

In the first embodiment, the core layer 6 is formed only in the location where adjustment is most required like the upper side of the probe head 3, and the core layer 6 is not buried in outer periphery of the substrate 4, and thus the through holes 42 can be easily formed in the outer periphery. Moreover, the wiring can be connected, via the through hole 42, to the terminal 8 of the test equipment on the surface in the opposite side of the side where the probe 2 protrudes, and thus even if a large number of terminals are provided, the wiring can easily be formed.

The probe 2 and the terminal 8 seem to have one-to-one correspondence through the wiring 41 and the through hole 42 in FIG. 2, however, the probe 2 also includes a probe used to be grounded and a probe to supply power (not shown). Therefore, some parts of the lines of the wiring 41 connected to the probes 2 are connected to a ground layer and a power supply layer, and thus all the lines of the wiring 41 are not always connected to the test equipment.

According to the first embodiment of the present invention, it is possible to structure the probe card without using the space transformer, unlike the conventional probe card 51 as shown in FIG. 13, by providing the probes that contact the electrodes arranged in the semiconductor wafer which is the test object and that input or output electrical signals to or from the electrodes, the probe head that holds the probes, the substrate having the wiring which is provided near the surface of the substrate facing the probe head so as to be contactable with the probe head and is connected to the probes, the core layer formed of the material which is buried in the substrate and has the coefficient of thermal expansion lower than that of the substrate, and the connecting member (including through holes connected to the wiring) that electrically connects at least some of the probes with the external device via the wiring. Therefore, the probe card is excellent in transmission characteristics of high-frequency electrical signals, and high-speed signal test can thereby be highly accurately conducted. Moreover, the assembly becomes easy because a smaller number of components are required, and the cost can thereby be reduced, which means economical.

Moreover, in the first embodiment, by burying the core layer in the substrate to make the degree of the thermal expansion close to the degree of the thermal expansion of the semiconductor wafer, displacement and warp are prevented from occurring in the substrate upon testing. Consequently, it is possible to realize uniform contact of all the probes with the semiconductor wafer, prevent the difference in the degree of wear between the probes to occur, and improve durability of the probes.

Modification of First Embodiment

Figure 4:
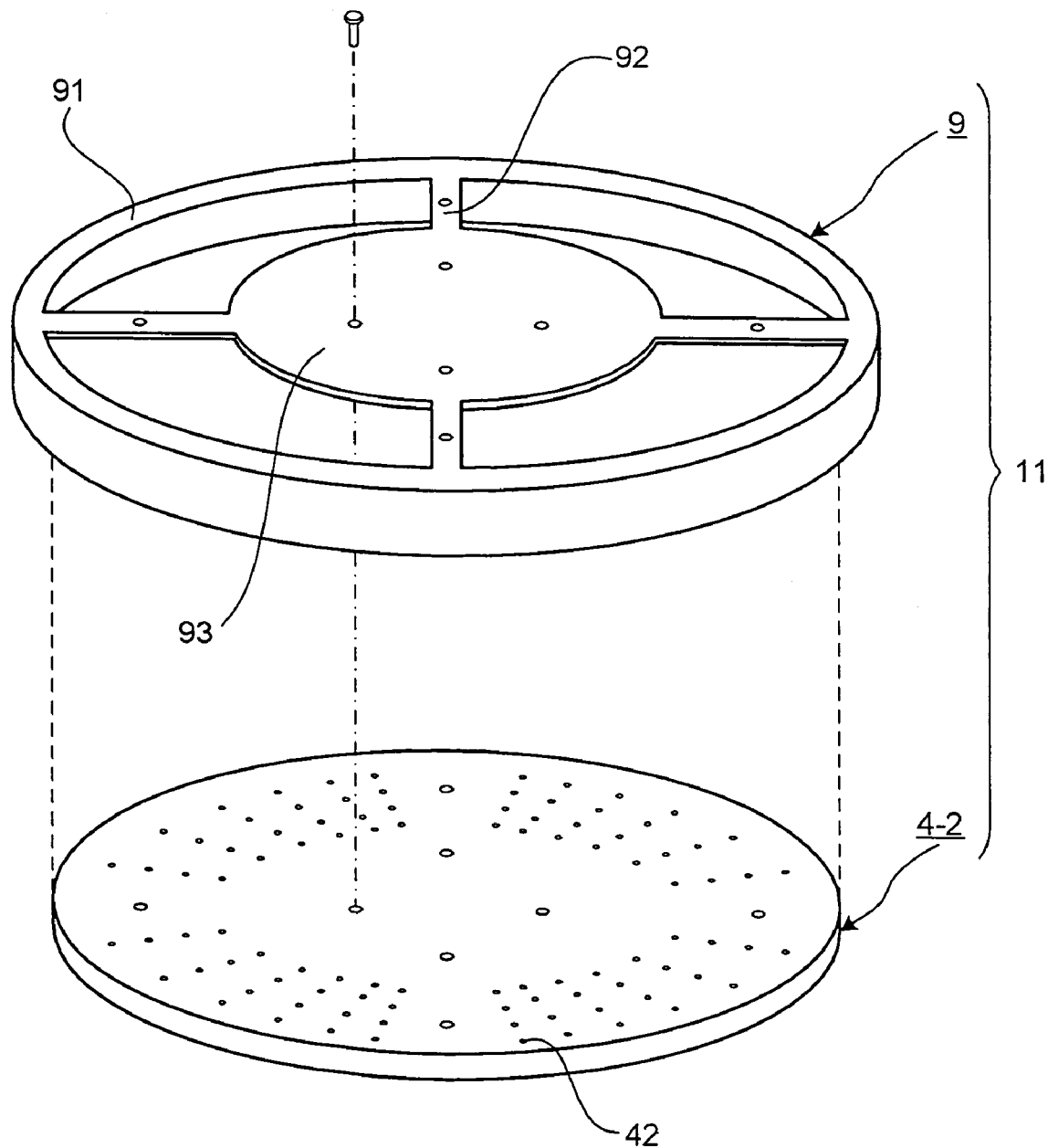
FIG. 4 is a plan view of a structure of a probe card according to a modification of the first embodiment.

FIG. 4 is a plan view of a structure of a probe card according to a modification of the first embodiment. A probe card 11 shown in this figure has a reinforcing element 9 attached to a substrate 4-2 structured in the same manner as the substrate 4. The reinforcing element 9 includes a circular outer peripheral portion 91 fitted around the outer periphery of the substrate 4-2, spokes 92 that extend from the inner side face of the outer peripheral portion 91 toward the center of the circle formed by the outer peripheral portion 91, and a central portion 93 formed in a disc shape having a center the same as that of the circle of the outer peripheral portion 91 and connected to the outer peripheral portion 91 via the spokes 92.

When the reinforcing element 9 is to be attached, the reinforcing element 9 is attached to the substrate 4-2 from its connection side to the test equipment (rear side of FIG. 1) and the spokes 92 and the central portion 93 are fixed to the substrate 4-2 via screws (in FIG. 4, only one screw is shown for simplicity). In this case, it is more preferable that the through holes 42 of the substrate 4-2 do not overlap an area where the spokes 92 and the central portion 93 are attached thereto. Any high-rigidity material for use as the reinforcing element 9 structured in the above manner includes alumite-finished aluminum, stainless steel, invar material, cobal material (TM), and duralumin.

According to one modification of the first embodiment, in addition to the same effect as that of the first embodiment, it is possible to more reliably prevent deformation of the probe card due to contact of the probes with the semiconductor wafer by enhancing the rigidity of the substrate using the reinforcing element.

Second Embodiment

Figure 5:
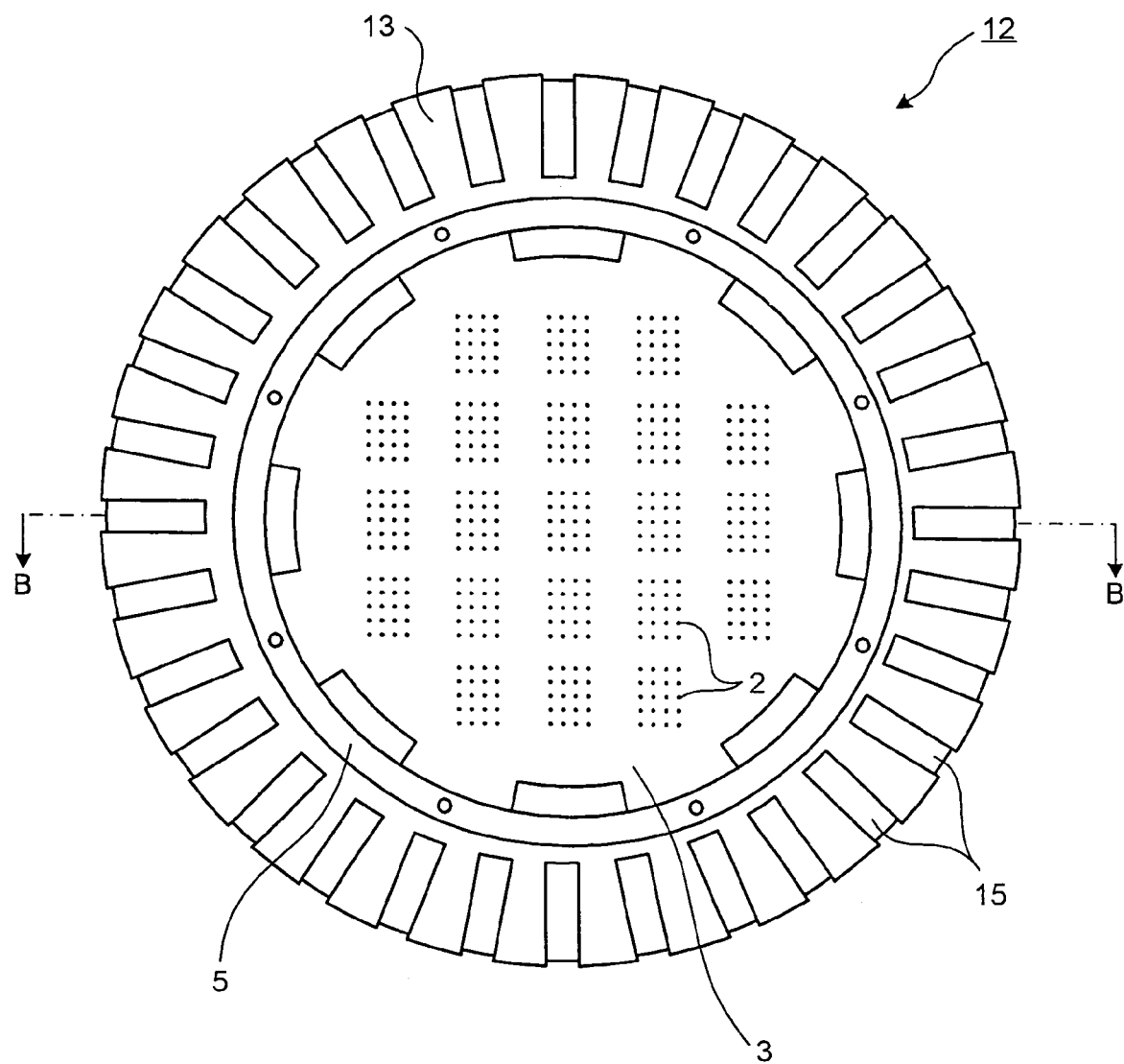
FIG. 5 is a plan view of a structure of a probe card according to a second embodiment of the present invention.
Figure 6:
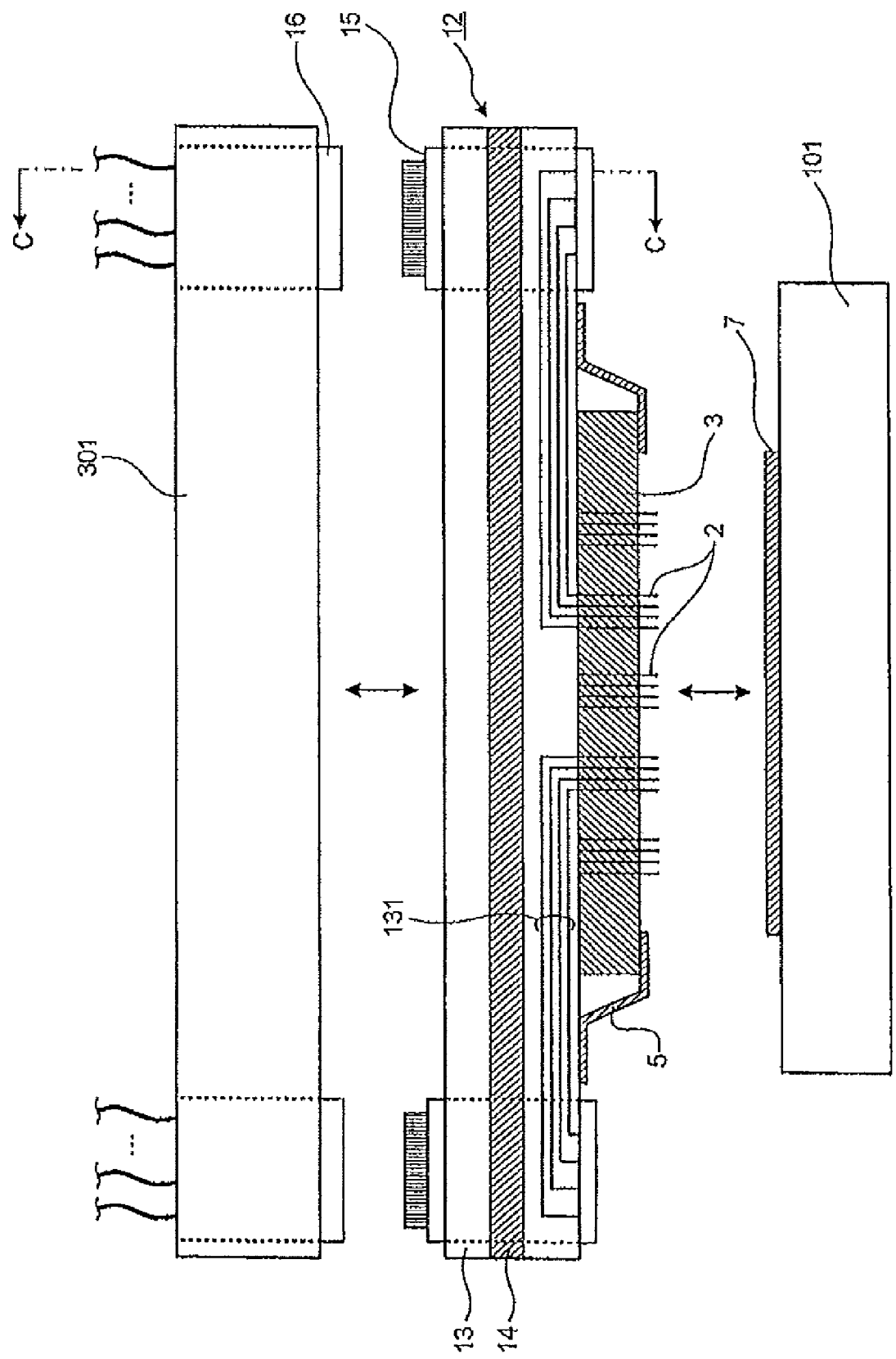
FIG. 6 is a cross section of part of a cross-sectional structure taken along the line B-B of FIG. 5.

FIG. 5 is a plan view of a structure of a probe card according to a second embodiment of the present invention. FIG. 6 is a cross section of part of a cross-sectional structure taken along the line B-B of FIG. 5. A probe card 12 as shown in these figures includes the probes 2 arranged according to a test object, the disc-like probe head 3 that holds the probes 2, a disc-like substrate 13 having its diameter larger than that of the probe head 3, the holding element 5 fixed to the substrate 13 and formed of a disc spring or a plate spring or the like to hold the probe head 3, a core layer 14 formed of a material which is layered and buried in the substrate 13 so as to have the same surface area as that of the substrate 13, and has a coefficient of thermal expansion lower than that of the substrate 13, and a plurality of male connectors 15 radially arranged with respect to the center of the substrate 13 so as to be connected to the test equipment.

The male connector 15 is paired with a female connector 16 provided at an opposite location in a connector seat 301 of the test equipment, to establish electrical connection between the probe 2 and the test equipment. In the second embodiment, a Zero Insertion Force (ZIF) type connector is used as a connector formed of the male connector 15 and the female connector 16 which form a pair. The ZIF type connector is a type which hardly requires external force when one of the pair of connectors to be mutually connected to each other is inserted in its counterpart or extracted therefrom. And, after the connectors are connected to each other, pressure contact force is applied thereto by external force, and mutual connecting terminals thereby come in contact with each other. An ordinary ZIF type connector can be used as the ZIF type connector (see, for example, Japanese Patent Application Laid-Open No. H07-42043 and Japanese Patent Application Laid-Open No. 2000-208570).

Figure 7:
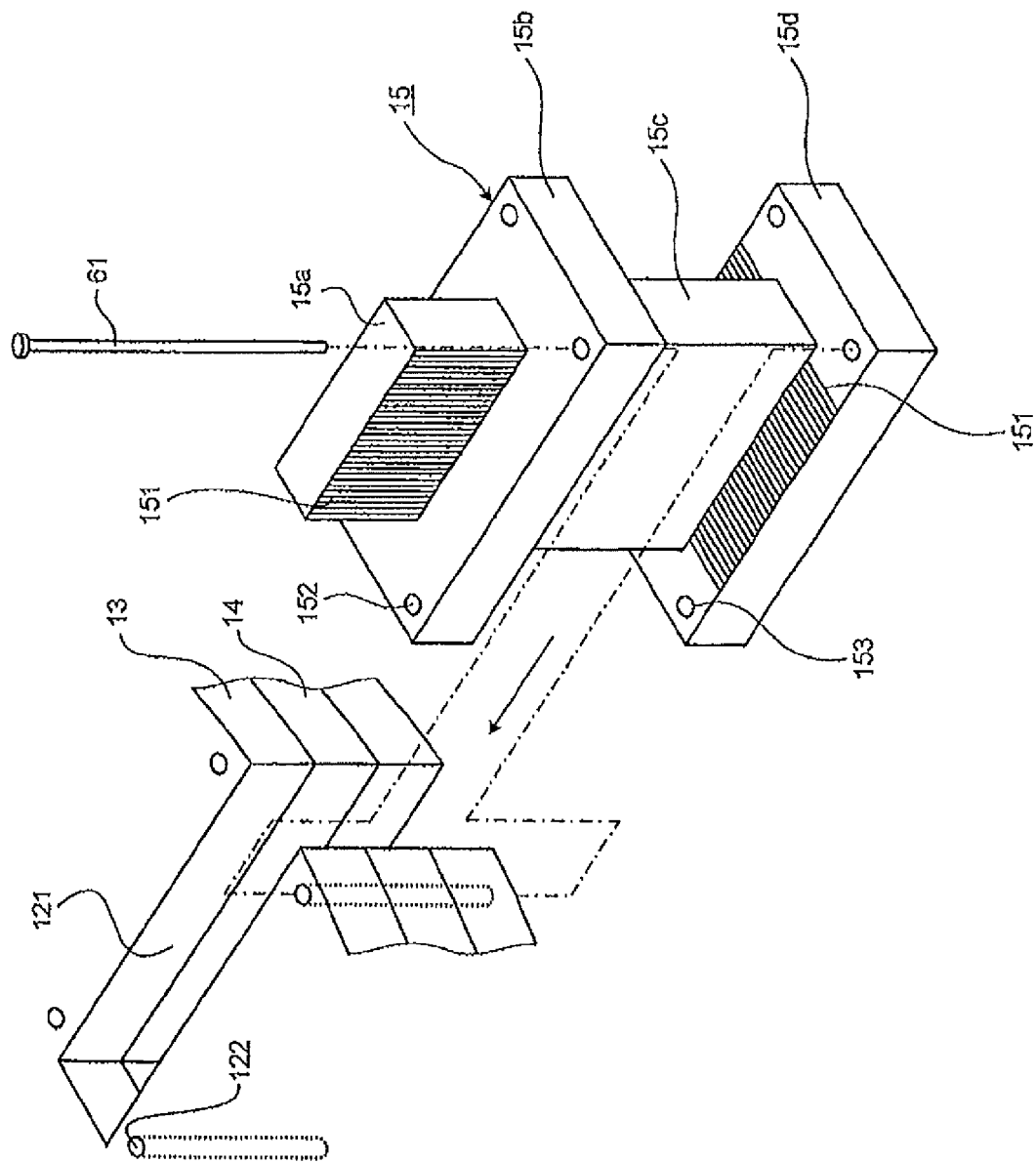
FIG. 7 is a schematic diagram of a structure of a male connector provided in the probe card according to the second embodiment.

FIG. 7 is a schematic diagram of a structure of the ZIF type male connector 15 used in the second embodiment. As shown in this figure, the male connector 15 is fitted in a cutout portion 121 formed in the substrate 13 (and core layer 14), and includes a connecting portion 15a that has a plurality of leads 151 exposed from its side face to be connected to the female connector 16 provided in the test equipment, a first flange portion 15b that is formed at the bottom edge of the connecting portion 15a and located on one surface of the substrate 13 (upper surface thereof in FIG. 7) when it is fixed to the substrate 13, and that services as a function of preventing the male connector from dropping out of the cutout portion 121, a trunk portion 15c that is inserted into the inner side of the cutout portion 121, and a second flange portion 15d that has a plurality of leads 151 exposed from its surface on the side of the trunk portion 15c, is located on the other surface of the substrate 13 (lower surface thereof in FIG. 7) when it is fixed to the substrate 13, and that services as a function of preventing the male connector from dropping out of the cutout portion 121. Both surfaces of the first flange portion 15b and the second flange portion 15d which face each other have almost the same area, and a plurality of holes 152 and 153 for insertion of a plurality of screws is formed at predetermined positions on the respective surfaces of the first flange portion 15b and the second flange portion 15d (four each in FIG. 7).

When the male connector 15 is fixed to the substrate 13, as shown in FIG. 7, the male connector 15 is slid from the outer periphery of the substrate 13 toward the center of the substrate 13 to be inserted therein. After the insertion, the holes 122 made in the substrate 13 and the holes 152 and 153 are aligned by using alignment pins, and by screwing a screw 61 into the corresponding holes 122, 152, and 153, the male connector 15 is fixed to the substrate 13 (in FIG. 7, only one screw 61 is shown for simplicity). Consequently, the leads 151 are strongly pressed against electrodes 132, and thus wiring 131 and the leads 151 can be reliably connected to each other. The leads 151 are not soldered to the electrodes 132 so that the male connector 15 is replaceable.

Figure 8:
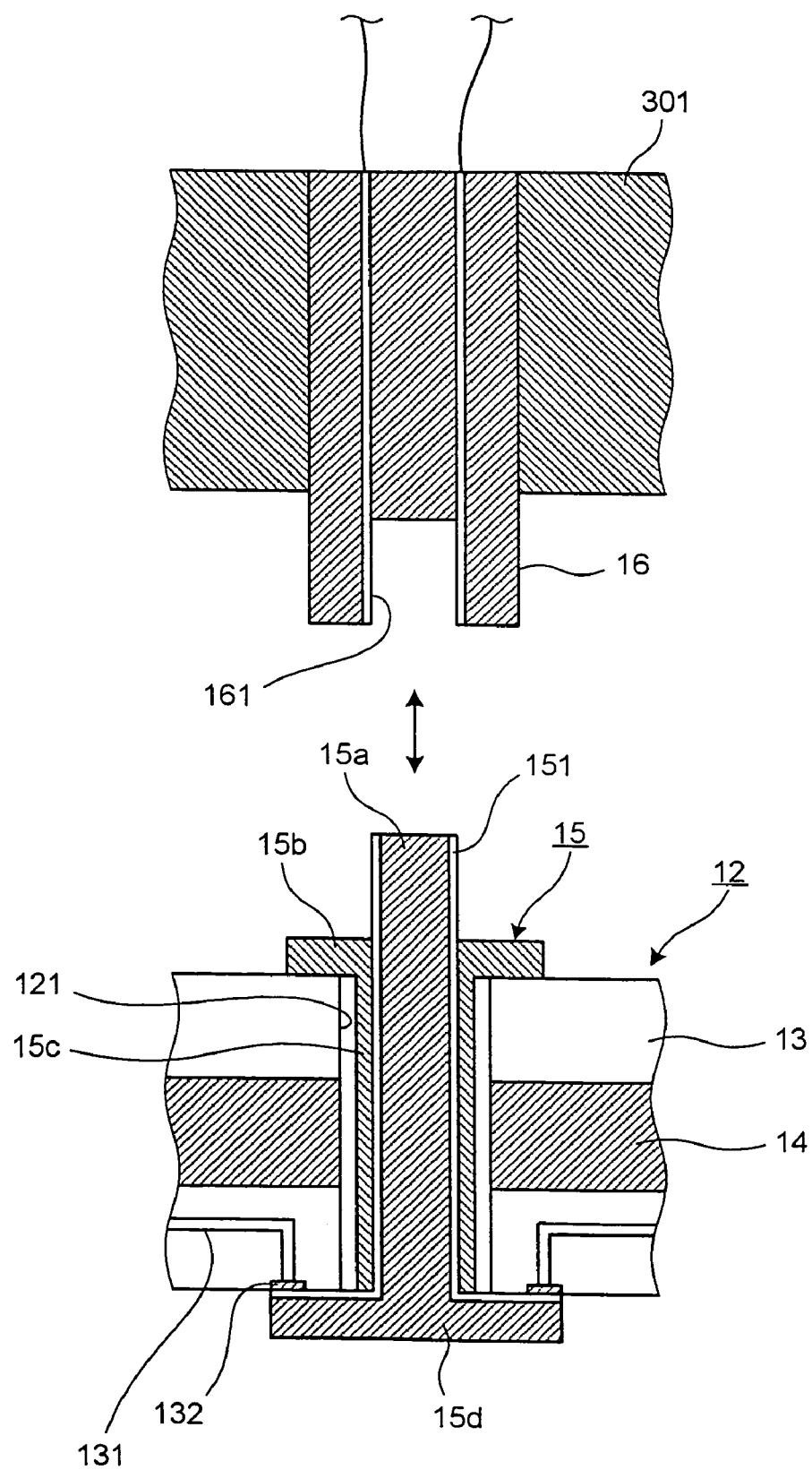
FIG. 8 is a schematic diagram of a structure of the probe card including the male connector as shown in FIG. 7.

FIG. 8 is a schematic diagram of a structure of the probe card 12 including the male connector 15, also is a schematic diagram of the female connector 16 provided in the connector seat 301 of the test equipment, and is a cross section taken along the line C-C of FIG. 6. As shown in FIG. 8, the lead 151 of the male connector 15 exposed from the upper surface of the second flange portion 15d is connected to any one of lines of the wiring 131 in the substrate 13 via the electrode 132 in the substrate 13. The lead 151 reaches the outer side face of the connecting portion 15a from the inner side of the trunk portion 15c through the first flange portion 15b and is exposed to the outside. On the other hand, a plurality of leads 161 is also exposed from a concave-shaped inner side face of the female connector 16. When the male connector 15 and the female connector 16 are connected to each other, the leads 151 and the leads 161 come in contact with each other to thereby establish electrical connection between the probe card 12 and the test equipment.

The first flange portion 15b of the male connector 15 serves not only as a function of preventing the male connector 15 from dropping out of the substrate 13 and also as a function of establishing reliable connection with the female connector 16 against the external force applied to itself, when the both connectors are fixed to each other, by a predetermined mechanism after the female connector 16 is brought into contact with the male connector 15.

According to the second embodiment of the present invention, similarly to the first embodiment, it is possible to provide the economical low-cost probe card excellent in transmission characteristics of high-frequency electrical signals by providing the probes that contact the electrodes arranged in the semiconductor wafer which is the test object and that input or output electrical signals to or from the electrodes, the probe head that holds the probes, the substrate having the wiring which is provided near the surface of the substrate facing the probe head so as to be contactable with the probe head and is connected to the probes, the core layer formed of the material which is buried in the substrate and has the coefficient of thermal expansion lower than that of the substrate, and the connecting member (including the male connector of the ZIF type connector) that electrically connects at least some of the probes with the external device via the wiring.

According to the second embodiment, it is possible to surely obtain electrical connection without producing stress by using the ZIF type connector as the connecting member, even if a large number of probes are provided and terminals have spring action and reaction force at the terminals becomes thereby enormous, so that the stress on the probe card and the tester becomes high. Therefore, even if the probe card has many probes and complicated wiring therein, faulty electrical continuity and degradation of the probe are difficult to occur, which allows improved durability of the probe card.

Moreover, in the second embodiment, the surface area of the core layer can be formed by substantially the same size as that of the substrate, and thus, the substrate can be easily formed and matching of the coefficient of thermal expansion of the core layer with that of the semiconductor wafer is further facilitated.

It is noted that, also in the second embodiment, the reinforcing element having the same structure as explained in the first embodiment can be attached to the substrate. Particularly, in the second embodiment, the cutout portion is formed in the outer periphery of the substrate, and this may cause some problem in strength to occur depending on materials of the substrate. In this sense, by attaching the reinforcing element, it is possible to prevent the problem of concern for the strength from occurring and add an appropriate strength to the substrate.

The shape of the male connector and the arrangement of the male connectors on the substrate are not always limited to these explained above, and thus the shape of the female connector provided in the test equipment and the arrangement of the female connectors may be changed according to the shape and the arrangement of the male connectors.

Third Embodiment

Figure 9:
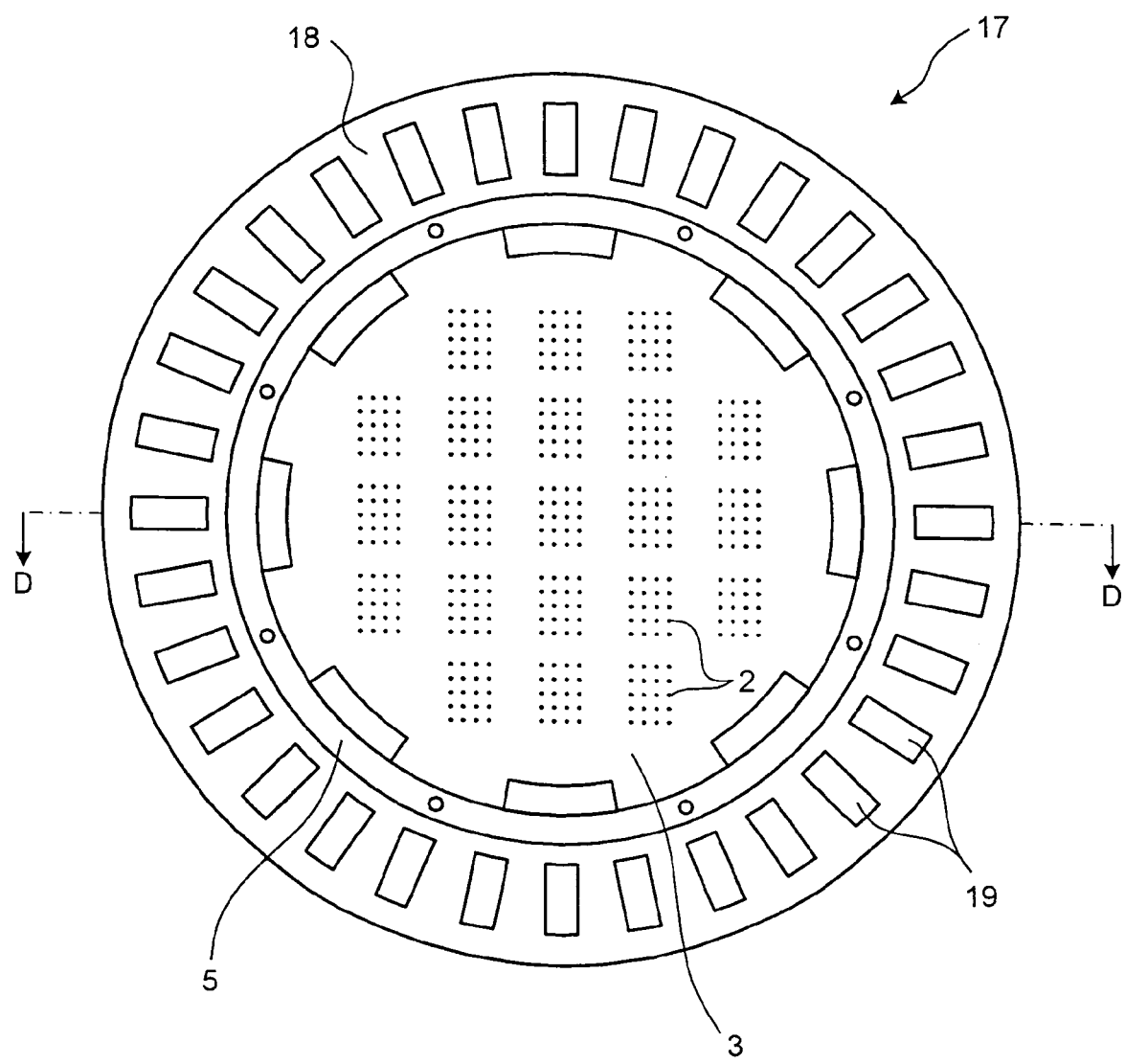
FIG. 9 is a plan view of a structure of a probe card according to a third embodiment of the present invention.
Figure 10:
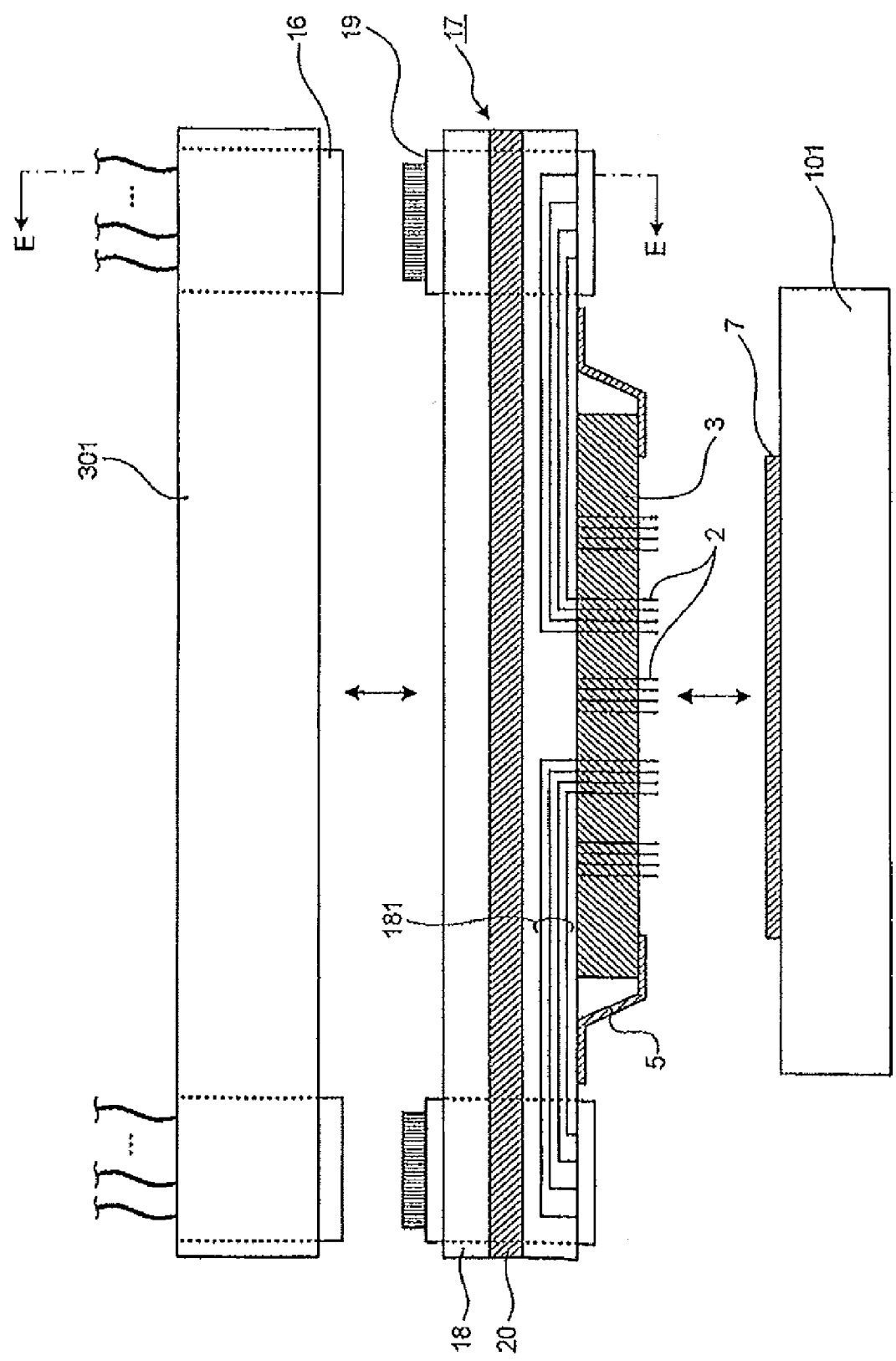
FIG. 10 is a cross section of part of a cross-sectional structure taken along the line D-D of FIG. 9.

FIG. 9 is a plan view of a structure of a probe card according to a third embodiment of the present invention. FIG. 10 is a cross section of part of a cross-sectional structure taken along the line D-D of FIG. 9. A probe card 17 shown in these figures includes the probes 2 arranged corresponding to a test object, the disc-like probe head 3 that holds the probes 2, a disc-like substrate 18 having its diameter larger than that of the probe head 3, the holding element 5 fixed to the substrate 18 and formed of a disc spring or a plate spring or the like to hold the probe head 3, a core layer 20 formed of a material which is layered and buried in the substrate 18 so as to have a surface area the same size as the surface area of the substrate 18, and which has a coefficient of thermal expansion lower than that of the substrate 18, and a plurality of ZIF type male connectors 19 radially arranged with respect to the center of the substrate 18 so as to be connected to the test equipment.

Figure 11:
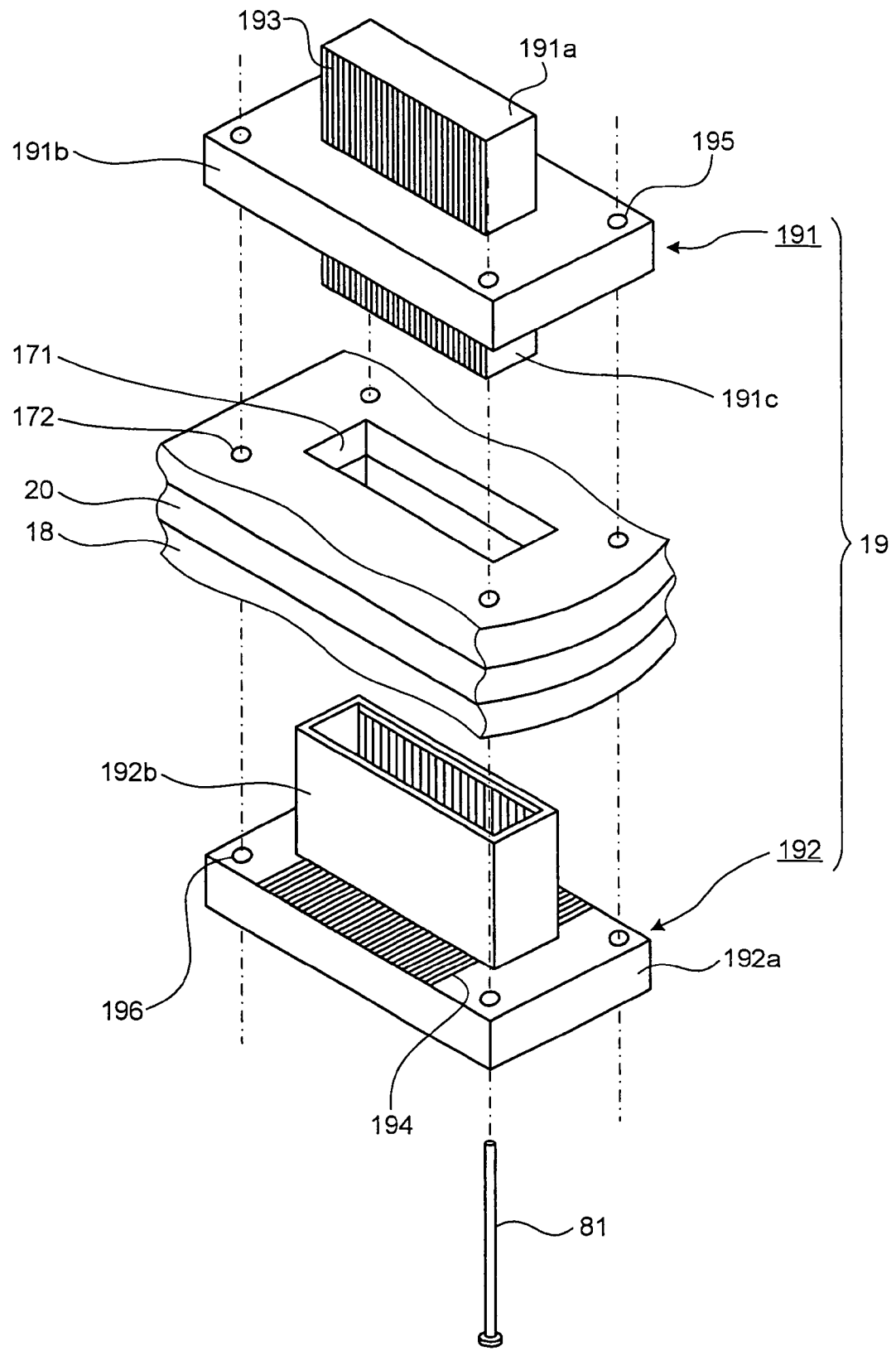
FIG. 11 is a schematic diagram of a structure of a male connector provided in the probe card according to the third embodiment.

FIG. 11 is a schematic diagram of a structure of the male connector 19. The male connector 19 shown in this figure is formed by combining two connectors. More specifically, the male connector 19 is structured to combine a first connector 191 which is connectable to the female connector 16 as a counterpart thereof, with a second connector 192 which is fitted in an opening 171 formed in the substrate 18 (and a core layer 20), is electrically connected to a wiring 181 of the substrate 18, and is connected to the first connector 191.

The first connector 191 includes a convex-shaped first connecting portion 191a fitted in the female connector 16 to be connected thereto, a third flange portion 191b located on one surface of the substrate 18 (upper surface thereof in FIG. 11) when it is fixed to the substrate 18, and a convex-shaped second connecting unit 191c connected to the second connector 192. The side faces of the first connecting portion 191a and the second connecting portion 191c are provided with a plurality of exposed leads 193. On the other hand, the second connector 192 includes a fourth flange portion 192a located on the other surface of the substrate 18 (lower surface thereof in FIG. 11) when it is fixed to the substrate 13, and a concave-shaped fitting portion 192b in which the second connecting portion 191c of the first connector 191 is fitted to be connected thereto. The upper surface of the fourth flange portion 192a and the inner side face of the fitting portion 192b are provided with a plurality of exposed leads 194.

Figure 12:
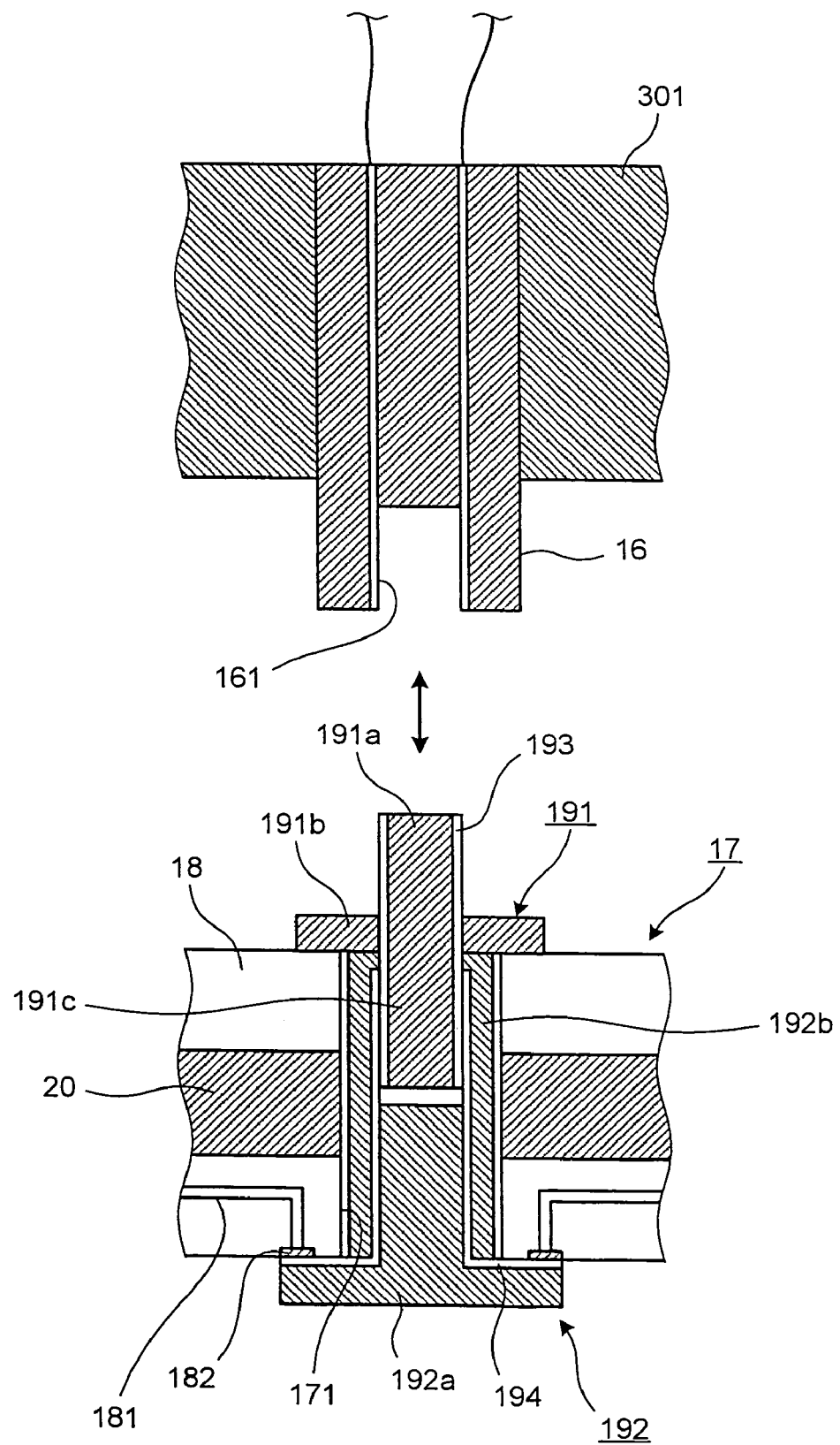
FIG. 12 is a schematic diagram of a structure of the probe card including the male connector as shown in FIG. 11.

FIG. 12 is a schematic diagram of a structure of the probe card 17 including the male connector 19, a schematic diagram of a structure of the ZIF type female connector 16 provided in the connector seat 301 of the test equipment, and a cross section taken along the line E-E of FIG. 10. As shown in FIG. 12, the second connector 192 has the lead 194 which is exposed from the upper surface of the fourth flange portion 192a and is connected to any one of the lines of the wiring 181 in the substrate 18 via the electrode 182 in the substrate 18. The leads 194 contact the leads 193 exposed from the surface of the second connecting portion 191c of the first connector 191, in the inner side face of the fitting portion 192b of the second connector 192. The lead 193 reaches the outer side face of the first connecting portion 191a from the second connecting portion 191c through the third flange portion 191b, and is exposed to the outside. Similarly to the second embodiment, when the male connector 19 is inserted in the female connector 16, the leads 193 contact the leads 161 exposed from the concave-shaped inner side face of the female connector 16, to thereby establish electrical connection between the probe card 17 and the test equipment.

It is noted that the surface of the second connecting portion 191c and the inner side face of the fitting portion 192b may be gold-plated. With this feature, further satisfactory electrical characteristics of the entire male connector 19 can be obtained when the first connector 191 and the second connector 192 are connected to each other.

When the male connector 19 is fixed to the substrate 18, the fitting portion 192b of the second connector 192 is attached to the opening 171, the second connecting portion 191c of the first connector 191 is fitted in the fitting portion 192b, and finally, the screw 81 is screwed into the hole 195 formed in the first connector 191, the hole 172 formed in the substrate 18, and the hole 196 formed in the second connector 192 (in FIG. 11, only one screw 81 is shown for simplicity). With these attachment, the leads 194 are strongly pressed against the electrodes 182, which allows reliable connection of the wiring 181 with the leads 194. To make the male connector 19 replaceable, the leads 194 are not soldered to the electrodes 182.

According to the third embodiment of the present invention, similarly to the second embodiment, it is possible to provide the economical low-cost probe card excellent in transmission characteristics of high-frequency electrical signals by providing the probes that contact the electrodes arranged in the semiconductor wafer which is the test object and that input or output electrical signals to or from the electrodes, the probe head that holds the probes, the substrate having the wiring which is provided near the surface of the substrate facing the probe head so as to be contactable with the probe head and is connected to the probes, the core layer formed of the material which is buried in the substrate and has the coefficient of thermal expansion lower than that of the substrate, and the connecting member (including the male connector of the ZIF type connector) that electrically connects at least some of the probes with the external device via the wiring.

According to the third embodiment, by dividing the male connector into two connectors, an opening has only to be formed in the substrate instead of forming the cutout portion in the substrate as is in the second embodiment. Therefore, more preferable effect can be obtained in terms of increased rigidity of the substrate. Moreover, the ground layer and the power supply layer of the substrate are kept connected without disconnection thereof in the outer periphery of the substrate, and thus the path for return current is ensured, which allows the transmission characteristics of high-frequency electrical signals to be further improved.

It is noted that, also in the third embodiment, the reinforcing element having the same structure as explained in the first embodiment may be attached to the substrate to enhance the rigidity of the substrate.

Similarly to the second embodiment, the shape of the male connector and the arrangement of the male connectors on the substrate are not always limited to these explained above, and thus the shape of the female connector provided in the test equipment and the arrangement of the female connectors may be changed according to the shape and the arrangement of the male connectors.

Other Embodiments

The first to the third embodiments are explained so far as the exemplary embodiments to implement the present invention, however, the present invention is not limited only by the three embodiments. For example, the probe card according to the present invention may include a substrate and a probe head formed in any shape other than the disc shape, and the shape thereof can be changed according to the shape of the test object or to the layout pattern of the electrode pads.

The probe used to the probe card according to the present invention is not limited by the probe 2 explained with reference to FIG. 3. In other words, the probe card according to the present invention can be structured by using any one of various types of known probes.

Furthermore, in the second and the third embodiments, fixing of the ZIF type male connectors to the substrate is explained, however, the ZIF type female connectors may be fixed to the substrate. In this case, the male connectors are naturally provided in the connector seat.

As explained above, the present invention can include various embodiments which are not described herein, and thus it is understood that various changes in design or the like may be made without departing from the technical ideas specified by the claims.

INDUSTRIAL APPLICABILITY

The probe card according to the present invention is useful for electrical continuity test of semiconductors or the like, and particularly suitable for the FWLT of collectively contacting the probes with at least about ¼ to ½ of dies on the semiconductor wafer.

The invention claimed is:

1. A probe card that inputs or outputs an electrical signal in or from a plurality of areas on a semiconductor wafer which is a test object, the probe card comprising:
   a plurality of probes that contacts a plurality of electrodes provided in the semiconductor wafer and that inputs or outputs an electrical signal in or from the electrodes;
   a probe head that holds the probes;
   a substrate having a wiring which is provided near the surface of the substrate facing the probe head so as to be contactable with the probe head and is connected to the probes;
   a core layer formed of a material which is buried in the substrate and has a coefficient of thermal expansion lower than that of the substrate, the core layer having a surface area substantially the same as that of the substrate; and
   a connecting member that electrically connects at least some of the probes with an external device via the wiring.

2. The probe card according to claim 1, wherein the connecting member includes either one of a zero insertion force type of male connector and that of female connector which form a pair and are to be mutually connected to each other.

3. The probe card according to claim 2, wherein the substrate includes a cutout portion in which either one of the male connector and the female connector is fitted.

4. The probe card according to claim 2, wherein the substrate includes an opening in which either one of the male connector and the female connector is fitted.

5. The probe card according to claim 4, wherein either one of the male connector and the female connector includes
   a first connector connectable with a connector as a counterpart thereof; and
   a second connector that is fitted in the opening, is electrically connected to the wiring, and is connected to the first connector.

6. The probe card according to claim 2, further comprising a reinforcing element attached to an outer periphery of the substrate.

7. The probe card according to claim 1, further comprising a reinforcing element attached to an outer periphery of the substrate.

* * * * *